United States Patent [19]

Perelle

[11] Patent Number: 5,638,002

[45] Date of Patent: Jun. 10, 1997

[54] MEASUREMENT CIRCUIT FOR A MODULAR SYSTEM OF ELECTRICAL CELLS CONNECTED IN SERIES, IN PARTICULAR FOR A SYSTEM OF THE STORAGE BATTERY TYPE

[75] Inventor: Michel Perelle, Parcay-Meslay, France

[73] Assignee: Saft, Romainville, France

[21] Appl. No.: 425,492

[22] Filed: Apr. 20, 1995

[30] Foreign Application Priority Data

Apr. 21, 1994 [FR] France .................................. 94 04807

[51] Int. Cl.$^6$ .............................................. G01N 27/416
[52] U.S. Cl. ............................. 324/434; 320/32; 320/48; 340/636
[58] Field of Search .......................... 324/434; 340/636; 320/32, 48, 56

[56] References Cited

U.S. PATENT DOCUMENTS

| | | |
|---|---|---|
| 4,833,459 | 5/1989 | Geur et al. . |
| 5,099,211 | 3/1992 | Nowak ............................ 324/434 |
| 5,214,385 | 5/1993 | Gabriel et al. ....................... 324/434 |
| 5,302,902 | 4/1994 | Groehl ............................. 324/434 |
| 5,371,682 | 12/1994 | Levine et al. ...................... 324/434 |
| 5,483,165 | 1/1996 | Cameron et al. .................... 324/434 |

FOREIGN PATENT DOCUMENTS

| | | |
|---|---|---|
| 0112242A1 | 6/1984 | European Pat. Off. . |
| 0277321A1 | 8/1988 | European Pat. Off. . |
| 2216277A | 10/1989 | United Kingdom . |
| WO917451 | 11/1991 | WIPO . |

OTHER PUBLICATIONS

*6th Annual Applied Power Electronics Conference and Exposition (APEC 91)*, 15 Mar. 1991, Dallas, Texas pp. 475–479—Novorloski et al. "A Microcomputer–Based Battery Management System".

*Primary Examiner*—Kenneth A. Wieder
*Assistant Examiner*—Jose M. Solis
*Attorney, Agent, or Firm*—Sughrue, Mion, Zinn, Macpeak & Seas

[57] ABSTRACT

The circuit has a common measurement transducer together with individual measurement interfaces for each of the cells. Each interface has its own generator for defining a measurement signal relating to a characteristic of the associated cell, and each of the interfaces has its own measurement signal output that is connected to the measurement transducer of the circuit via a common single-wire link. Each interface also includes two ports, operable in alternation so that one constitutes an input for control pulses transmitted to the interface while the other acts as an output for relaying such pulses after they have been received. Each interface also includes means for forcing a signal to be emitted via its measurement signal output to the measurement transducer of the circuit in the event of a threshold being crossed by a measurement element that monitors a characteristic of the cell with which the interface is associated.

4 Claims, 2 Drawing Sheets

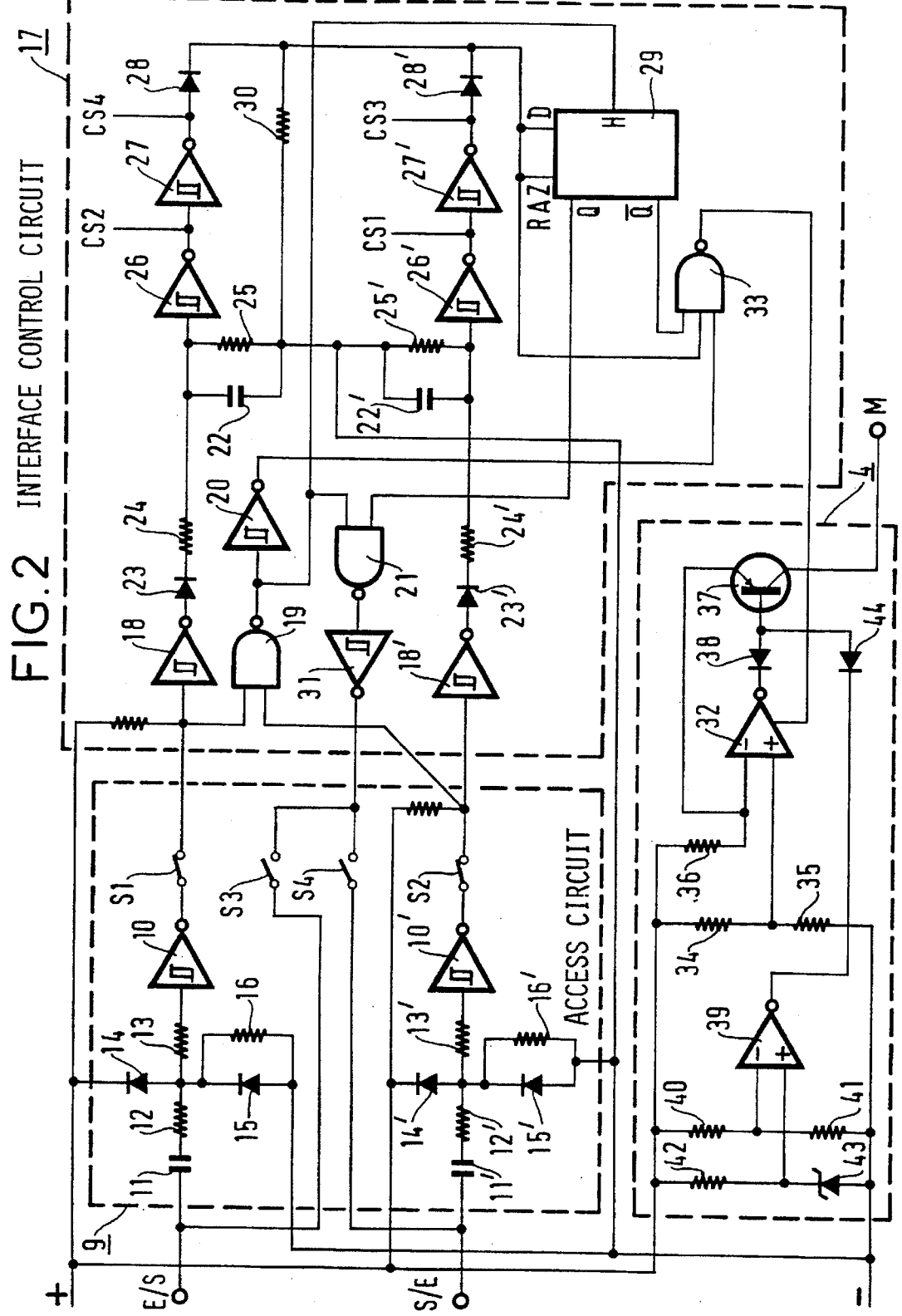

MEASUREMENT CIRCUIT FOR A MODULAR SYSTEM OF ELECTRICAL CELLS CONNECTED IN SERIES, IN PARTICULAR FOR A SYSTEM OF THE STORAGE BATTERY TYPE

The invention relates to a measurement circuit for a modular system made of electrical cells connected in series.

BACKGROUND OF THE INVENTION

The use of certain modular electrical systems made up of cells that are electrically connected in series is capable of considerable optimization, particularly when the number of cells is relatively large, providing it is possible easily to monitor the operation of each of the cells, and consequently providing it is possible to perform measurements on a per cell basis, or at least on the basis of small groups of cells in a given system. This can apply, for example, for modular systems that may be of the storage battery type, of the supercapacitor type, of the superconverter type, or of any other type, providing the systems are individually and modularly made up of cells whose individual operation needs to be monitored in a supervisory logic circuit.

Unfortunately, although it might appear simple in theory to make a circuit suitable for performing such measurements, e.g. electric voltage measurements on a cell by cell basis, in fact, it becomes complicated as soon as the number of cells becomes large. The large number of measurement wires then required generally leads to implementations that are relatively expensive, and that require switching to be installed, giving rise to a large number of switching units which, particularly if they are of the electromagnetic type, have given rise to such circuits being little used, and generally only in special implementations where they are virtually inevitable.

OBJECT AND SUMMARY OF THE INVENTION

The invention therefore provides an improvement to a measurement circuit for a modular system of cells that are electrically connected in series, each being constituted by one or more elements for producing, storing or converting electrical energy. The measurement circuit incorporates a common measurement transducer plus individual measurement interfaces for the various cells. Each of the interfaces has its own generator for determining a measurement signal representative of some varying characteristic of the cell to which the interface in question is allocated. Each interface has a measurement signal output connected to the common measurement transducer via a single-wire link common to all of the interfaces. Each interface responds to receiving a first control impulse by transmitting to the common transducer the measurement signal as produced by its own generator, and then relays to a following interface any subsequent control pulses it receives before the end of a determined limiting time period after an immediately preceding control pulse.

According to a characteristic of the invention, each interface includes two ports operable in alternation such that one acts as an input for control pulses transmitted to the interface while the other acts as an output for such pulses after they have been received, the port selected as the input for any new control pulse train being that one of said ports which receives the first pulse of a train.

According to another characteristic of the invention, the measurement signal generator of at least one of the interfaces includes means operable at any time for forcing the emission of a priority signal via the measurement outlet serving it to the common measurement transducer on detecting a special event as determined by a measurement element monitoring a characteristic of the cell to which the interface under consideration is allocated.

BRIEF DESCRIPTION OF THE DRAWINGS

The invention, its characteristics, and advantages are described in Greater detail below with reference to the figures, in which:

FIG. 2 is an electrical circuit diagram of a particular embodiment of an individual cell interface for a measurement circuit of the invention.

MORE DETAILED DESCRIPTION

Figure 1:
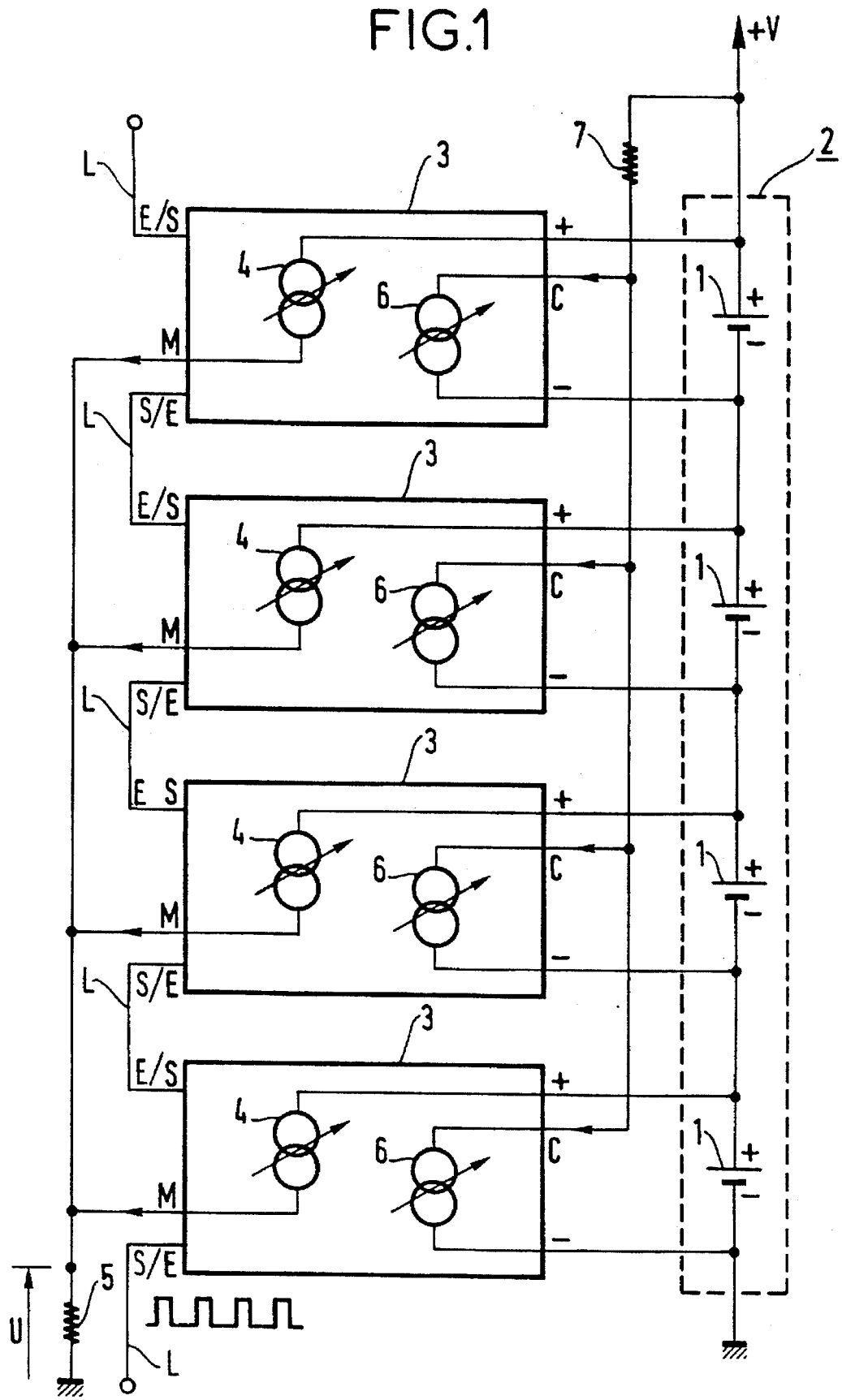
FIG. 1 is a block diagram of a measurement circuit for a modular electrical system.

As shown symbolically in FIG. 1, the measurement circuit of the invention is designed to be associated with a modular electrical system made up of a plurality of cells 1 that are connected in series via power transmission terminals thereof, each cell being conventionally assumed to have two terminals, one referenced "+" and the other "−". The system 2 is assumed to be made up of cells 1, each of which comprises one or more elements that, for example, produce, store, or convert electrical energy. The measurement circuit is designed to enable information to be collected relating to the operation of the cells, in particular on an individual level.

The measurement circuit shown diagrammatically in FIG. 1 serves, for example, to determine the value of the DC voltage present across the terminals of each of the cells 1 in the modular electrical system 2 made up of elements or blocks of elements in a storage battery type electrical power supply. The cells of the system are connected in series within the system via their energy transmission terminals, each cell being identically made up of one or more elements and including two energy transmission terminals marked "+" and "−".

According to the invention, the measurement circuit includes individual measurement interfaces 3 for each of the cells 1 in the system 2 with which it is associated. Each interface 3 is connected, in this case, to the terminals of the corresponding cell and it includes a switchable measurement signal generator 4. In the example shown, each interface 3 is connected to the "+" and "−" terminals of a cell and it includes a measurement signal generator 4 which delivers a current signal. The generator is shown as being inserted between the "+" terminal of the cell 1 with which it is associated and one of the terminals of a measurement transducer 5.

The purpose of the transducer 5 is to transform the measurement signals provided by the generators 4 of the interfaces 3 into signals representative of the magnitudes measured by the interfaces. In the example envisaged above, a generator 4 supplies a measurement signal in the form of a current, thus producing a representative signal which occurs, for example, in the form of a voltage across the transducer 5. This image voltage corresponds, for example, to the voltage present across the terminals of the cell to which the interface is connected that includes the generator 4 under consideration. Naturally, the representative signal could be obtained in some other form, e.g. in the form of a signal whose duration there is as a function of the measurement performed.

In the embodiments envisaged herein, the transducer 5 is common, being used with all of the individual interfaces 3 of the measurement circuit. It has one of its two terminals connected to a ground potential that is common to the measurement circuit and to the system constituted by the series-connected cells 1, and it is connected via its other terminal to the measurement output M of the generator 4 in each of the interfaces 3, via a common single-wire link for transmitting measurements. The transducer 5 is assumed to be associated with a supervisory logic circuit (not shown) which may be organized, for example, about a microprocessor and which is suitable for interpreting the information relating to the operation of the system as transmitted by the transducer 5.

Each current generator 4 is switched, e.g. by means of a control pulse which, in this case, is assumed to be transmitted within a control pulse train TI in which each pulse is assumed to be destined for a particular interface in the run of interfaces 3 of the measurement circuit, which interfaces are assumed to be interconnected in series. For safety reasons, the cells are connected so as to be able to receive control pulses from either of the two ends of the run that they constitute, each of the cells having two inlet/outlet ports given respective references E/S and S/E, and capable of being operated so that one constitutes an inlet and the other an outlet, or vice versa, on request and according to requirements, as described below with reference to FIG. 2.

The controlling pulse train TI is assumed to be delivered by conventional type generator means at the supervisory logic circuit (not shown) to one or other of the ends of the run made up by the interfaces 3. Pulses are conveyed through the successive interfaces and by means of various link elements making up the single-wire control link L1 between the successive interfaces.

In the example shown more particularly in FIG. 1, the pulses are assumed to be sent to the interface circuit 3 serving the cell 1 whose negative terminal "−" is directly connected to the common ground potential.

Each of the interfaces is designed to take account for its own purposes of the first pulse it receives in a control train from either of its two ports E/S and S/E, i.e. the port S/E in the above example, after which it relays any subsequent pulses in the train via its other port, in this case E/S, so that it is received by the port (in this case S/E) of the interface which is connected thereto via a control link element L and which can thus be considered as being the interface downstream therefrom.

The generator 4 of an interface 3 is switched ON by the pulse in the control train which is taken into account by the interface, and this is performed in a manner that is explained below. In response thereto, the generator delivers a measurement signal to the transducer 5, which measurement signal is a function of the cell 1 associated with the interface. If the transducer 5 is a resistor, as assumed above, then a voltage appears across the terminals of the resistor and that voltage is representative of the voltage present across the terminals of the corresponding cell 1. Each of the successive pulses in a control train TI therefore puts the generator 4 of one of the interfaces temporarily into connection with the transducer 5, with this taking place in the serial order of the interfaces, starting from the interface that receives the first pulse in a train which is assumed in this case to be made up of periodic binary pulses. In the example described, the portions having binary value "zero" of the pulses in a given train TI successively trigger the switching ON of the generator 4 in each of the interfaces 3 that are connected to the cells 1, starting from the interface which receives and retains the first pulse in each control train, i.e. the interface connected to the cell 1 which is directly connected to common ground potential in the example mentioned above. This causes a train of voltage pulses to appear across the terminals of the resistor that constitutes the transducer 5, in which train each pulse (in this case the pulses are positive) is representative of the voltage present across the terminals of the cell then put into circuit with this transducer resistor via the associated generator 4.

In addition, if it is necessary for the current taken from each cell in the system 2 during successive measurements performed under the control of a pulse train to be a balanced current, then provision can be made to associate a second switchable current generator 6 in each of the interfaces 3 with a common compensation element 7 that corresponds, at least approximately, to the transducer 5 in the measurement circuit. This compensation element 7 which may be of the resistor type, for example, is connected to the positive terminal "+V" of the system 2 of cells 1 and also to each of the second generators in the measurement circuit via a second terminal. Each second current generator 6 is assumed to be switched by the same control signal as the generator 4 associated therewith in the interface 3 that includes both of them, it is inserted between the common compensation element 7 of the measurement circuit (with which it is connected in this case by a terminal reference C), and the "−" terminal of the cell 1 associated with the interface 3 that includes the second current generator.

Thus, when an interface 3 associated with a cell 1 is switched ON, energy is extracted by the first measurement signal generator 4 of said interface at least from said cell 1, and also from any other cell 1 in the system 2 that is connected between ground potential and said cell 1 with which the interface under consideration is associated. Simultaneously energy is also taken by the second generator of the same interface 3, at least from the cell 1 with which the interface is associated and also from all of the other cells 1 in the system 2 that are inserted between the positive terminal "+" of said system and the cell 1 with which the interface under consideration is associated. Each time energy is taken it is optionally shared. Whenever energy is taken it is distributed in balanced manner over all of the cells in the system 2, with each measurement series corresponding to a complete train of control pulses.

An embodiment of an individual measurement interface for a cell in a circuit of the invention is given in FIG. 2, with the two ports E/S and S/E of said interface 3 being connected to an access circuit 9 which enables control pulses coming from either of said two ports to be received, either for the purpose of being processed locally or else for being relayed via the other port, as explained below.

The access circuit 9 has two identical input/output circuits, each serving one of the ports E/S, S/E, and switching members symbolized in this case by four contacts given references S1 to S4. These members are assumed to be controlled by signals taken from levels respectively referenced CS1 to CS4 in order to simplify the diagram, which members are preferably implemented in electronic form, e.g. as C-MOS switches. Two of the switching members are designed to transmit control pulses that may come from one of the ports served, such as, in this case, S1 for pulses coming from the port E/S and S2 for pulses coming from the port S/E. The other two switching members are designed to relay received control pulses that are to be forwarded to another interface, either via the port E/S for member S3, or via port S/E for member S4.

A first input/output circuit for the access circuit 9 comprises a logic inverter 10 of the threshold inverting amplifier type. This inverter is fed with control pulses coming from port E/S via a capacitor 11 for removing the DC component and via a group of two resistors 12 and 13 that are connected in series. The inverter 10 is powered from the "−" and "+" terminals of the "associated" cell to which the interface is connected (not shown in FIG. 2). Two diodes 14 and 15 are connected in series between the above-mentioned "−" and "+" terminals and provide a peak-clipping circuit in which the anode of diode 14 and the cathode of diode 15 are connected to the point common to resistors 12 and 13. A high resistance resistor 16 is connected in parallel with the diode 15 to fix the potential in the absence of any control pulse coming from the port E/S, thus completing the first input/output circuit. This circuit is designed to transmit pulses of the control train TI that it receives to an interface control circuit 17, via switching member S1. It is also designed to relay, via switching member S3, any pulse it receives via the control circuit 17 and coming from the port S/E heading to an interface then made accessible via the port E/S.

The second input/output circuit included in the access circuit 9 performs an analogous function. It is designed to connect input port S/E to the interface control circuit 17 via switching member S2, in the same manner as is performed by the first input/output circuit for input port E/S and via switching member S1. Thus, it is constituted like the first circuit and thus comprises components referenced 10' to 16' which correspond to the components referenced 10 to 16 as described above. It also serves to relay, via switching member S4, any pulses received by the control circuit 17 from the port E/S and heading for an interface then made available via the port S/E.

The control circuit 17 includes a logic inverter 18 of the threshold inverting amplifier type, and a NAND type gate 19, both of which are suitable for being connected via one input to the output of the inverter 10 in the access circuit 9 via the switching member S1. It also includes an inverter 18' of the same type as the inverter 18 and suitable for being connected via its input and together with a second input of the gate 19 to the output of the inverter 10' in the access circuit 9, via switching member S2. The output from the gate 19 feeds both a logic inverter 20, of the threshold inverting amplifier type, and "access controlling" input of a NAND gate 21.

A capacitor 22 is connected by a first terminal to the output of the inverter 18, via a diode 23 and a resistor 24 connected in series, and by a second terminal that is connected to the "−" terminal of the cell associated with the measurement interface including the capacitor. The capacitor charges on the arrival of the first pulse in the control train TI transmitted by the switching member S1 which is then in its conductive state, and it remains substantially charged throughout the duration of the pulse train. A resistor 25 connected in parallel with the capacitor 22 enables it to discharge at the end of the pulse train.

The common point between the capacitor 22 and the resistors 24 and 25 is connected to the input of a first logic inverter 26 in series with a second inverter 27 whose output is connected to the anode of a diode 28. An analogous circuit is implemented by means of a capacitor 22', resistors 24' and 25', inverters 26' and 27', and a diode 28'. The diodes 28 and 28' and a resistor 30 which is itself connected to the "−" terminal are connected together at a common point to form a logic OR type circuit. The output from this circuit controls the data input D and the clear input RAZ of a D-type bistable 29.

In the event of a prolonged absence of any received pulse, in practice after a time has elapsed that is greater than a set limit time corresponding to the discharge time of the capacitor 22, the capacitor 22 will have discharged completely via resistor 25. The output signal from the inverter 26 thus takes up binary level "1", thereby putting switching member S2 in the conductive state, whereas a "zero" level output signal from the inverter 27 puts the switching member S4 in the non-conductive state. The bistable 29 then has its data input D and its clear input RAZ both held at "zero".

The control circuit 17 also includes a second circuit made up of components referenced 18' and 22' to 28' which are connected in the same manner as the corresponding components referenced 18 and 22 to 28, so as to respond to control pulses that may come via the port S/E in a manner that is identical to that described above for control pulses that may come from the port E/S. As before, this has the particular effect that in the prolonged absence of any control pulse coming from the port S/E via the switching member S2 (which is itself in the conductive state in the event of a prolonged absence of any control pulse received by the port E/S), the capacitor 22' is no longer charged. The output signal from the inverter 26' is then at binary level "1" causing switching member S1 to be put into the conductive state, while the output from inverter 27' puts switching member S3 in the non-conductive state.

Consequently, in the prolonged absence of any control pulse coming from either of the ports E/S and S/E, the switching members S1 and S2 are conductive waiting for a control pulse, and the arrival of such a pulse will serve to cause one or other of the capacitors 22 to 22' to become charged. The arrival of such a new pulse will cause a temporary disconnection in that one of the two input links as established via switching members S1 and S2 that is not being used to convey the received pulse. The corresponding switching member S1 or S2 is then put into the non-conductive state for a period of time that corresponds to at least the time required to discharge the capacitor that has received a pulse.

Simultaneously, that one of the two switching members S3 and S4 which is connected to the port E/S or S/E via which the received control pulse has not been transmitted is now put into the conductive state. This switching to the conductive state as controlled by a change in the level of the output signal from one or other of the inverters 27 or 27' makes it possible to use that one of the two ports E/S and S/E via which the control pulse was not received as an output port.

The arrival of a first pulse in a control train TI and reaching the control circuit 17 via one of the ports, e.g. the port E/S, causes a squarewave to appear at the output from the inverter 17, but after a delay that corresponds to the time required for charging the capacitor 22.

Consequently, a logic level 1 signal is applied to the D input of the bistable 29. The clock input H of the bistable 29 is connected to the output of the gate 19 and as a result the Q output reproduces the logic level represent at the D input and the inverse logic level is reproduced on the Q output. Thus, the receipt of a first pulse in a control train by the control circuit 17 via the switching member S1 causes said first pulse to be applied to the clock input H of the bistable 29 via the gate 19, while the clear input RAZ of said bistable is still at level "zero", thereby inhibiting the bistable and preventing it from copying an input state to its outputs.

The NAND type control gate 21 is connected to the output of the gate 19 via a first input and to the data output Q of the bistable 29 via a second input, and it is also connected via a logical inverter 31 to a point which is common to both switching members S3 and S4. It therefore serves to relay the pulses it receives from the gate 19 under the control of the bistable 29, but with the exception of the first pulse in each new train received by the corresponding interface via switching member S1, since for that pulse the gate 19 is switched off by the bistable 29.

The control pulses transmitted by the control gate 21 are applied to the point which is common to both switching members S3 and S4 so as to be transmitted via that one of said members which is then conducive, i.e. either via switching member 24 when the control pulses reach the control circuit 17 via switching member S1, or else switching member S3 when the control pulses reach the control circuit 17 via switching member S2. The pulses are then transmitted either via port S/E to the adjacent interfaces connected to that port via its own port E/S, assuming that switching member S4 is conductive, or else via port E/S to the other adjacent interface which is connected to said port E/S via its own port S/E, assuming that it is switching member S3 that is then conductive.

At the end of the squarewave output by the inverter 27, following the end of the pulse train, the bistable 29 is reset to zero once the capacitor 22 has discharged, as has the capacitor 22'.

The bistable 29 also controls the measurement signal generator 4 of the interface 3 that includes it, said generator being constituted in this case by means of an element such as a measurement amplifier 32. The negative power supply terminal thereof is controlled by the Q output of the bistable 29 via a NAND type gate The gate 33 is connected via a first input to the Q output of bistable 29, via a second input to the point common to the cathodes of the diodes 28 and 28' via which the D and clear inputs of the bistable 29 are controlled, and via a third input to the output from the inverter 20. It therefore applies power to the measurement amplifier 32 throughout the period between the first pulse of the control train as received via one of the ports E/S and S/E, and the next pulse to be received, with power being controlled via the negative power supply terminal of the amplifier.

The measurement amplifier 32 also has its power supply connected to the "+" terminal of the associated cell as connected to the interface which includes it. It has a non-inverting input connected to the point common to a two-resistor divider bridge (34, 35) connected across the "+" and "–" terminals of the associated cell, thereby taking account of the voltage present thereat. It also has an inverting input connected firstly via a resistor 36 to the same "+" terminal, and secondly to the emitter of a PNP type transistor 37 whose collector is connected to the single-wire output M via which the interface 3 is itself connected to the resistor constituting the transducer 5 common to all of the cell interfaces in the present example. The measurement amplifier 32 is connected to compare the voltages applied to its two inputs.

When powered, i.e. while a first pulse is being applied to the interface in a control train TI, it, consequently uses its output to control the base of the transistor 37 via a non-return diode 38 in such a manner as to cause the transistor to provide the transducer-constituting resistor 5 with a current measurement signal that is a function of the voltage provided to the interface 3 by the associated cell 1.

A control pulse train is relayed via one or other of the ends of the run constituted by the measurement interfaces 3 associated with the cells in the system to be monitored, thereby giving rise to a measurement pulse train appearing at the transducer 5 in which each pulse has been produced by a different one of the interfaces on receiving the first of the pulses relayed thereto.

The order in which measurement pulses arrive corresponds to the serial order of the interfaces starting from the end of the run formed by the interfaces to which the train of control pulses was applied for the purpose of triggering measurement.

The fact that each interface can be controlled via two distinct ports makes it possible to trigger the production of measurement pulses from said interface even if one or other of the ports is no longer accessible, e.g. because of a fault occurring on one of the control link elements or one of the interfaces whereby said port receives control pulses.

In one embodiment of the invention, provision is also made for a second element to force a priority signal to be sent, e.g. for safety purposes, at any moment whenever some special determined event is detected. This second element may be constituted, for example, by a measurement amplifier 39 included in the generator 4 for the purpose of detecting any excess voltage that might affect the associated cell, and of informing the supervisory logic circuit of the monitor system accordingly. This amplifier 39 may, for example, have an inverting input connected to the common point of a two-resistance divider bridge 40, 41, that is connected across the "+" and "–" terminals of the associated cell being monitored, and a non-inverting input connected to the point common firstly to a resistor 42 that is connected to the above-considered "+" terminal and secondly to a reference, constituted in this case by a zener type diode 43 whose anode is connected to the "–" terminal and whose cathode is connected to the common point. If the voltage present across the "+" and "–" terminals of the monitored cell exceeds the value that has been fixed and that is set by the diode 43, then the output from the measurement amplifier 39 which is normally positive switches to a zero value, thereby causing the transistor 37 to conduct, which transistor has its base connected to the amplifier 39 via a non-return diode 44.

Conduction of the transistor 37 causes a current to appear on the transducer 5, even though no control pulse has been triggered by the supervisory logic circuit, for example. It is possible to limit the value of this current as injected by the transistor 37 under such conditions by inserting a two-resistor divider bridge (not shown) between the "+" terminal of a monitored cell and the output of the corresponding measurement amplifier 39, and by connecting the cathode of the diode 44 to the common point between the two resistors of the bridge (not shown).

It is then possible to detect the presence of cells suffering simultaneously from excess voltage, as soon as fault occurs giving rise to said excess voltage, since the measurement signal generators 4 of the cells concerned are then simultaneously active and power the transducer 5 in parallel. The transducer 5 then carries a current whose value is a function of the number of cells concerned by the fault, thereby enabling the supervisory logic circuit to determine said number.

Naturally, the interfaces of the circuit of the invention can easily be adapted to performing measurements other than those mentioned herein, providing they are modified in ways within the competence of the person skilled in the art. It is also possible to associate auxiliary circuits with the interfaces to enable each interface to transmit in succession information relating to measurements of different kinds, without thereby going beyond the ambit of the invention.

I claim:

1. A measurement circuit for a modular system of cells that are electrically connected in series, each being constituted by one or more elements for producing, storing or converting electrical energy, said circuit incorporating a common measurement transducer plus individual measurement interfaces for the various cells, each of which interfaces includes its own generator for determining a measurement signal representative of some varying characteristic of the cell to which the interface in question is allocated, each interface having a measurement signal output connected to the common measurement transducer via a single-wire link common to all of the interfaces, each of said interface responds to receiving a first control impulse by transmitting to the common transducer the measurement signal as produced by its own generator, and then relays to a following interface any subsequent control pulses it receives before the end of a determined limiting time period after an immediately preceding control pulse, wherein each interface includes two ports operable in alternation such that one acts as an input for control pulses transmitted to the interface while the other acts as an output for such pulses after they have been received, the port selected as the input for any new control pulse train being that one of said ports which receives the first pulse of a train.

2. A measurement circuit according to claim 1, wherein the measurement signal generator of at least one of the interfaces includes means for forcing the emission of a priority signal to the common measurement transducer via the measurement signal output on detecting a condition as determined by a measurement element monitoring a characteristic of the cell to which the interface under consideration is allocated.

3. A measurement circuit according to claim 1, wherein each measurement interface includes an access circuit having two input/output ports for control pulses, each port being selectively connected firstly via an input circuit to one of first switching members suitable for connecting it to the input of an interface control circuit whereby emission from the measurement signal generator of the interface is triggered, and each of said port being selectively connected secondly to an output of an interface control circuit via one of second switching members for relaying control pulses received by the interface to a following interface, the first and second switching members being controlled by the interface control circuit in such a manner that the first switching members are made conductive in the absence of any control pulse being received over a period of time that is greater than said determined limiting time period via one or other of the interface ports, the reception of a control pulse relayed by one of said ports via one of the first switching members being used by the control circuit to switch the other of said first switching members to the non-conductive state and to switch into the conductive state that one of the second switching members which is connected to the other port.

4. A measurement circuit according to claim 1, wherein at least one of the measurement interfaces includes a measurement signal generator including:

a first element that functions in accordance with a first varying characteristic specific to the cell with which the interface is associated, and which is connected to the measurement output of said interface to emit said measurement signal under control of the control circuit of said interface in response to a first received control pulse; and a second element which determines when a value of a measured condition of the cell with which the interface is associated exceeds a threshold level, and outputs a signal at the measurement output of said interface as soon as the threshold is exceeded by said value.

* * * * *